United States Patent
Rey et al.

(10) Patent No.: US 11,584,636 B2
(45) Date of Patent: Feb. 21, 2023

(54) HINGE OFFERING A REDUCED SENSITIVITY TO INTERNAL STRESSES

(71) Applicant: COMMISSARIAT A L'ENERGIE ATOMIQUE ET AUX ENERGIES ALTERNATIVES, Paris (FR)

(72) Inventors: Patrice Rey, Grenoble (FR); Loic Joet, Grenoble (FR); Thierry Verdot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 382 days.

(21) Appl. No.: 16/840,552

(22) Filed: Apr. 6, 2020

(65) Prior Publication Data
US 2020/0317505 A1   Oct. 8, 2020

(30) Foreign Application Priority Data

Apr. 8, 2019  (FR) ...................... 19 03731

(51) Int. Cl.
*B81B 3/00* (2006.01)
*E05D 1/02* (2006.01)

(52) U.S. Cl.
CPC .............. *B81B 3/0072* (2013.01); *E05D 1/02* (2013.01); *B81B 2201/0235* (2013.01); *B81B 2201/042* (2013.01); *B81B 2203/0154* (2013.01)

(58) Field of Classification Search
CPC .......... B81B 3/0072; B81B 2201/0235; B81B 2201/042; B81B 2203/0154; E05D 1/02
See application file for complete search history.

(56) References Cited

U.S. PATENT DOCUMENTS

| | | | | |
|---|---|---|---|---|
| 6,392,220 B1* | 5/2002 | Slater | ................. | H04Q 11/0005 73/514.01 |
| 9,581,188 B2* | 2/2017 | Jourdan | ................ | B81B 3/0051 |

(Continued)

FOREIGN PATENT DOCUMENTS

| EP | 2 211 185 A1 | 7/2010 |
|---|---|---|
| FR | 2 983 844 A1 | 6/2013 |

OTHER PUBLICATIONS

French Preliminary Search Report dated Jan. 23, 2020 in French Application 19 03731 filed on Apr. 8, 2019 (with English Translation of Categories of Cited Documents), 2 pages.

(Continued)

*Primary Examiner* — Lex H Malsawma
(74) *Attorney, Agent, or Firm* — Oblon, McClelland, Maier & Neustadt, L.L.P.

(57) ABSTRACT

A hinge for a micromechanical and/or nanomechanical structure includes: a support, and a movable part in an out-of-plane direction. The hinge allows for the out-of-plane displacement of the movable part. The hinge further includes two torsion beams extending along the axis of rotation of the hinge, two bending elements mechanically connecting the movable part and the support and having at least one pair of a first and of a second beam parallel with each other and extending in a plane perpendicular to the axis of rotation, the first beam being connected to the support and the second beam being connected to the movable part, the first and second beams being connected to one another by a first connecting element at a longitudinal end, the two beams extending in the same direction from the first connecting element.

16 Claims, 8 Drawing Sheets

(56) References Cited

U.S. PATENT DOCUMENTS

2014/0331770 A1\* 11/2014 Jourdan ................. G01P 15/02
73/514.01
2014/0338450 A1   11/2014 Classen

OTHER PUBLICATIONS

U.S. Appl. No. 15/248,756, filed Aug. 26, 2016, 2017/0059420 A1, Rey, P, et al.
U.S. Appl. No. 15/625,314, filed Jun. 16, 2017, 2017/0363421 A1, Maspero, F, et al.
U.S. Appl. No. 16/064,123, filed Jun. 20, 2018, 2019/0011260 A1, Onfroy, P, et al.
U.S. Appl. No. 16/331,264, filed Mar. 7, 2019, 2019/0218643 A1, Pellet-Rostaing, S, et al.
U.S. Appl. No. 16/348,004, filed May 7, 2019, Joet, L, et al.
U.S. Appl. No. 16/466,432, filed Jun. 4, 2019, 2019/0308873 A1, Joet, L
U.S. Appl. No. 16/590,015, filed Oct. 1, 2019, 2020/0102211 A1, Joet, L, et al.
U.S. Appl. No. 16/716,632, filed Dec. 17, 2019, Dagher, S, et al.
U.S. Appl. No. 16/721,578, filed Dec. 19, 2019, Dagher, S, et al.
U.S. Appl. No. 16/717,866, filed Dec. 17, 2019, Hilt, T, et al.

\* cited by examiner

HINGE OFFERING A REDUCED SENSITIVITY TO INTERNAL STRESSES

TECHNICAL FIELD AND PRIOR ART

The present invention relates to an out-of-plane hinge for a micro and/or nanomechanical structure, in particular for a microelectromechanical system, offering a reduced sensitivity to internal stresses.

Microelectromechanical systems or MEMS and micro and nanoelectromechanical systems or M&NEMS systems are used to make sensors or actuators. They comprise at least one element that is movable in relation to a substrate. For example in the case of a sensor, the displacement of the movable part or mass is measured and can be tranduced into a characteristic to be detected, for example an acceleration, and in the case of an actuator, the movable element is displaced for example by means of electrostatic forces, for example for displacing a micromirror.

The movable element is suspended with respect to the substrate and according to the applications it may be desired that it have a displacement in the plane on the system or an out-of-plane displacement, i.e. orthogonally to the plane of the system.

FIG. 1 shows an example of a microelectromechanical structure of the prior art.

The structure extending in the plane XY, comprises a mass 1000 able to be displaced in an out-of-plane direction Z with respect to a support 1002. The structure comprises hinge 1004 between the support 1002 and the mass 1000 having an axis of rotation Y1 in the plane. The hinge connects an edge of the mass to the support. The hinge comprises two beams 1006 intended to be solicited in torsion and coaxial to the axis of rotation and two beams 1008 intended to be solicited in bending and orthogonal to the axis of rotation. The beams 1006 and 1008 connect the mass to the support. This structure also comprises two piezoresistive gauges 1010 that make it possible to measure the displacement of the mass. The bending beams 1008 have for function to rigidify the articulation formed by the hinge in the direction X. However they also cause a rigidification of the articulation in the out-of-plane direction, which is not desirable. In order to reduce the effect thereof on the rigidity in the direction Z, the thickness of the bending beams is reduced.

Such a structure is produced by the methods of microelectronics that implement depositions, etchings and a release of the mass. For example the structure is made by etching in a layer formed by epitaxy on a Silicon on Insulator (SOI) substrate and the mass is released by etching the buried oxide layer of the SOI substrate.

During the making of the layer via epitaxy, stresses are generated in the layer. These stresses can in particular by due to doping. For example, the boron atoms are smaller than those of silicon and induce a stress in compression in the crystalline cell of the silicon. This stress can also appear before the epitaxy, during the doping of the thin layer of the SOI substrate. During the release of the structure by etching, these stresses in all the layers are at least partially released. However this releasing of the stresses generates a new balance of the forces and moments that can lead to a deformation of the structure. The bending beams are formed in the epitaxied layer. During the release of the structure, the stresses in the beams expand/retract. However the gauges, which are parallel to the bending beams, oppose the expansion/retraction of the bending beams. As the bending beams and the gauges are in different planes, the mass tilts. It is then no longer perpendicular to the axis Z. When the internal stresses come from the thin layer of the SOI substrate, as the gauges 1010 are not aligned, they will induce a torque on the mass and cause it to turn in the plane. In addition, the internal stresses of the lower layer of the bending beams cause them to bend, causing an inclination of the mass.

A deformation of the structure can also occur during the release of stresses in the SOI substrate.

However this inclination and more generally a deformation of the structure have several disadvantages. On the one hand, it induces a stress in the gauges, which may not be negligible with respect to the stress on a full measuring scale, which has the effect of reducing the range of variation of the stress or can then cause an exceeding of the maximum permissible stress.

On the other hand, a microelectromechanical structure can comprise top and bottom abutments in order to limit the out-of-plane travel of the mass, so as to prevent the exceeding of the permissible stresses. When the mass is not tilted, it is at rest at an equal distance from the top and bottom abutments. However in case of inclination of the mass, the distances between the mass and the top and bottom abutments are different. If the mass is tilted towards the support, the distance between the mass and the bottom abutment is less than that between the mass and the top abutment. If the inclination of the mass were known, the abutments could be adapted to offset this difference in distance, however such an adaptation complicates the method of production. Furthermore it is difficult to predict the inclination of the mass.

The deformation of the structure can also occur in the absence of stress gauges.

Generally, it is desirable that the structure not be deformed.

DISCLOSURE OF THE INVENTION

It is consequently a purpose of the present application to offer an out-of-plane hinge for a micro and/or nanomechanical structure with a reduced sensitivity to internal stresses.

The purpose mentioned hereinabove is achieved by an out-of-plane hinge for a micro and/or nanomechanical structure that comprises a support, at least one movable part in an out-of-plane direction with respect to the support, a hinge intended to connect the movable part to the support which allows for an out-of-plane displacement of the movable part, the hinge comprising at least one element intended to be deformed in torsion and aligned along the axis of rotation of the hinge, and at least one element intended to be deformed in bending and extending perpendicularly to the axis of rotation of the hinge. The bending element comprises at least one pair of bending beams mechanically connected together by at least one connecting element, the bending element mechanically connecting the movable part and the support via the pair of bending beams, one being mechanically connected directly to the support and the other being mechanically connected directly to the movable part.

The connecting element connects a first zone of one of the bending beams to a first zone of the other bending beam, and a second zone of one of the bending beams is connected to the mass and the second zone of the other bending beam is connected to the substrate. The two beams are parallel to one another and the two bending beams extending in the same direction from the first zone to their second zone.

In an advantageous embodiment, the first zones of the beams are located on one side of the axis of rotation and the second zones of the beams are located on the other side of the axis of rotation.

One of the bending beams of the pair is directly connected to the support and the other bending beam of the pair is directly connected to the movable part and the two beams are directly connected together at a longitudinal end. Under the effect of a uniform stress, the two beams will extend/retract in the same way. By placing them in series, the two extensions will cancel out. Likewise, in case of a non-uniform stress in the out-of-plane direction, for example when stresses are induced in the thin layer of the SOI substrate independently of the epitaxy, the two beams will also bend in the same way. Here again the effect of these deformations is cancelled by placing them in series.

In other terms, a structure is carried out comprising a pivot articulation comprising at least one bending element comprising at least one pair of pair of bending beams parallel and connected in series in such a way that the releasing of the stresses drives the displacement only of the ends of the beams connected together, not the end of one of the beams directly connected to the movable part. The released stresses therefore do not cause any deformation of the structure.

In a particularly advantageous example, the bending element or elements comprise several pairs of bending beams, the pairs being mechanically connected together, which can make it possible to carry out an articulation in rotation that has a stiffness close to that of the articulations in rotation of the prior art and without losing in maintaining in the plane.

One subject-matter of the application is a hinge for a micromechanical and/or nanomechanical structure comprising a support, at least one movable part in an out-of-plane direction with respect to the support, said hinge being intended to suspend the movable part from the support allowing for the out-of-plane displacement of the movable part, the hinge comprising at least one torsion element comprising at least one beam aligned with or parallel to the axis of rotation of the hinge and intended to be deformed in torsion, at least one bending element intended to be deformed in bending, said bending element mechanically connecting the movable part and the support and comprising at least one pair of a first and of a second beam parallel with each other and extending in a plane perpendicular to the axis of rotation of the hinge, the first beam being directly connected to the support and the second beam being directly connected to the movable part, the first and second beams being connected to one another by a first connecting element at least at one of the longitudinal ends thereof, the first and second beams extending in the same direction from the first connecting element.

Another subject-matter of the application is a microelectromechanical system comprising at least one structure of the invention.

The system can comprise means for measuring the displacement of the movable part in the out-of-plane direction, comprising at least one stress gauge.

BRIEF DESCRIPTION OF THE DRAWINGS

The present invention shall be better understood based on the following description and the accompanying drawings wherein.

DETAILED DISCLOSURE OF PARTICULAR EMBODIMENTS

The present invention relates to micromechanical and/or nanomechanical structures, and more particularly the MEMS and/or NEMS structures applied for example to accelerometers, gyrometers, gas sensors, actuators, etc.

In the present application "micromechanical structure" means a micromechanical and/or nanomechanical structure, a MEMS and/or NEMS structure.

Figure 2:
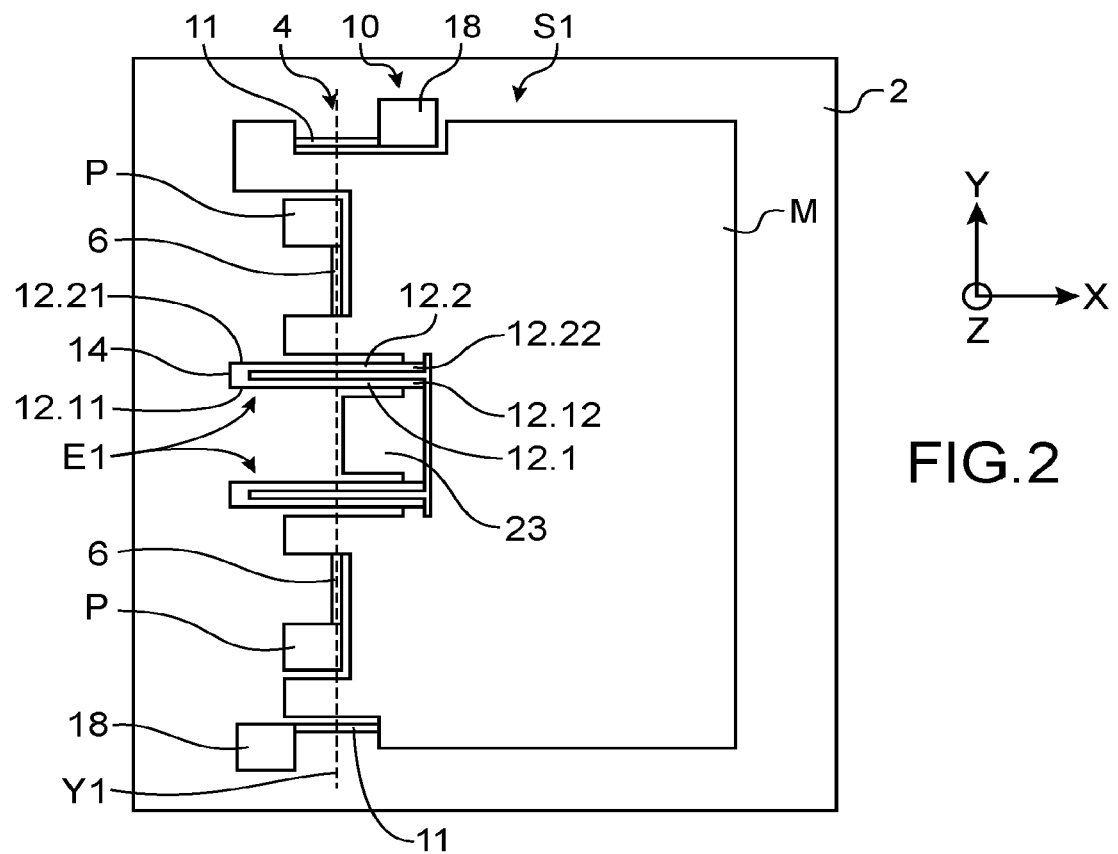
FIG. 2 is a top view of a structure according to an embodiment.

FIG. 2 diagrammatically shows an example of a structure S1.

The structure S1 comprises a movable part M suspended from a support 2 by means of a hinge or pivot articulation 4.

For example, the movable part M can be a inertial mass in the case of an accelerometer, or a micromirror or a platform that can be oriented in the case of an actuator.

The movable part M extends in the plane of the structure defined by the axes X and Y. The plane of the structure is the mean plane of the structure that corresponds to the plane of the sheet as shown in FIG. 2.

The suspended portion is intended to be displaced in an out-of-plane direction Z, orthogonal to the axes X and Y.

The hinge 4 has an axis Y1 parallel to the axis Y.

The hinge 4 is connected to an edge of the suspended part M.

In the example shown, the hinge 4 comprises two beams 6 that extend along the axis Y1 and intended to be solicited in torsion during the displacement of the movable mass in the out-of-plane direction. Each torsion beam 6 is connected by a longitudinal end to an anchoring stud P of the support, and by another longitudinal end to the movable part M.

The hinge also comprises two elements E1 that extend perpendicularly to the axis Y1 between the movable part M and the support 2. The elements E1 are intended to be solicited in bending and shall be designated in the description as "bending elements". In this example, the elements E1 are disposed inside the space between the two torsion beams 6 in the direction Y.

In this example and very advantageously, the structure is symmetrical with respect to an axis X1, except for the stress gauges which shall be described hereinbelow, the elements E1 are then disposed symmetrically with respect to the axis X1.

The two elements E1 have similar structures, only one of these elements will be described in detail.

The bending element E1 comprises a pair of bending beams mechanically connected in series.

In this example, each element E1 comprises a pair of bending beams 12.1, 12.2 mechanically connected to one another directly by a first longitudinal end 12.11, 12.21 by a transverse beam 14. In this example, the ends 12.11 and 12.21 are located on the same side of the axis of rotation Y1.

Advantageously, the axis of rotation Y1 passes through the middle of the bending beams and by the torsion beams. In this configuration, the bending beams have their minimum thickness. However a configuration wherein the axis of rotation Y1 would not pass through the middle of the bending beams belongs to the scope of the present invention.

The second longitudinal end 12.12 of the first beam 12.1 is directly connected to an anchoring stud 23 and the second longitudinal end 12.22 of the second beam 12.2 is directly connected to the movable part M.

The first ends 12.11 and 12.21 of the first and second beams are free to move together, which allow the beams to be deformed together under the effect of the release of the internal stresses in the direction X, without the latter applying any force on the structure and deforms it. Since the beams substantially have the same characteristics, i.e. substantially the same dimensions at the margins due to the production method, and are made in the same layer or layers, the internal stresses in the direction X in the two beams are close or equal. Since the effects of the internal stresses on the two beams are substantially the same, each bending beam of each pair allows the other beam a release of its internal stresses with a reduced effect of the bending element on the structure.

In the example shown the two elements E1 are connected to the same anchoring stud, but this is not limiting. A structure with an anchoring stud dedicated to each bending beam does not leave the scope of the present invention.

The structure S1 also comprises means for measuring 10 the displacement of the movable part. In this example, these are stress gauges 11 suspended between the movable part and anchoring studs 18 of the support and are disposed in a plane separate from a plane parallel to the plane XY and containing the axis of rotation Y1.

The gauges 11 are disposed in such a way that, when a gauge is solicited in traction, the other is solicited in torsion.

This embodiment has the advantage of offering greater flexibility in the out-of-plane direction.

Figure 3:
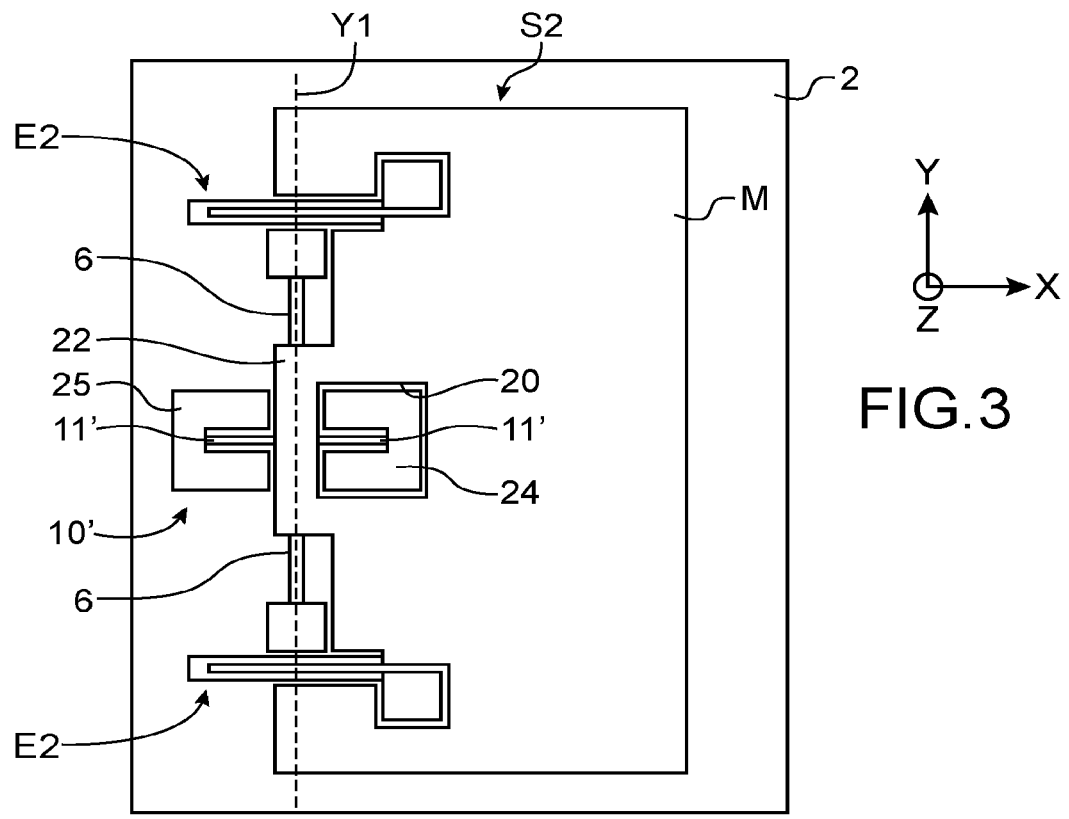
FIG. 3 is a top view of a structure according to another embodiment.

FIG. 3 shows another embodiment of a structure S2 close to the structure S1, wherein the torsion beams are disposed between the elements E2 which are similar to the elements E1. In this example the elements E2 are connected to separate anchoring studs.

The structure S2 also comprises means for measuring the displacement 10' of the movable part comprising stress gauges, which are disposed at the centre of the structure between the two torsion beams 6. In this example and advantageously, the two gauges 11' are aligned with one another along the axis X. The movable part comprises a window 20 of which a post 22 extends along the axis of rotation Y1. An end of a gauge 11' is fixed to an edge of the post 22 of this window 20, and the other end of the gauge is fixed to an anchoring stud 24 disposed in line with the window 20. The other gauge 11' is located outside the window 20, an end being fixed to the other edge of said post 22 and an edge being fixed to an anchoring stud 25.

The gauges 11' are located in a plane different from the plane containing the axis of rotation Y1 in such a way as to be solicited in traction or in compression when the movable part pivots around the axis Y1.

The alignment of the gauges 11' has the advantage of limiting the effect of the gauges on the movable part. Indeed in this arrangement, the gauges oppose their internal stresses, which are not released. On the contrary, in the structure S1, the internal stresses of the gauges can be released and cause a rotation of the movable part.

In this example, the bending elements E2 are farther apart from one another along the axis of rotation than in the case of the structure S1, which increases the stiffness with regards to a rotation in the plane.

Figure 4:
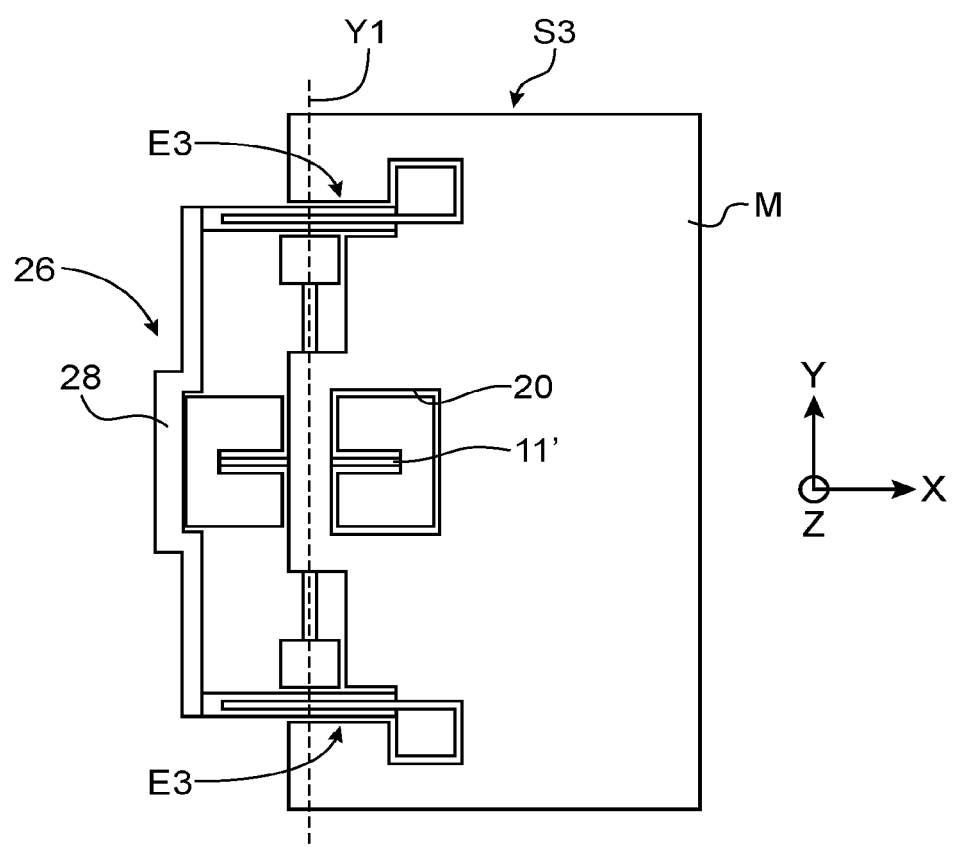
FIG. 4 is a top view of a structure according to another embodiment that implements a connecting element between the bending elements.

FIG. 4 shows another particularly advantageous embodiment of a structure S3 that offers a reduced sensitivity to the displacements in the direction X.

The structure S3 is similar to the structure S2 and further comprises a connecting means 26 that rigidly connects the two bending elements E3. The connecting means 26 comprises a rigid beam 28 extending substantially in the direction Y. In this example the beam 28 has the shape of a slot that takes account of the anchoring stud. Alternatively, the beam 28 is straight.

In the present application, "rigid beam" means a beam that does not deform, or negligibly, under the forces subjected in the normal use of the structure. The beam 28 connects the free ends of the bending beams.

The beam 28 has the advantage of reducing the movements of the movable mass in the plane without hindering the rotation of the movable mass around the axis Y1 in normal operation.

Indeed, in normal deformation mode, the beam 28 has no effect on the operation of the device because the free ends of the beams are displaced in the same way, driving the beam 28 with them without any additional force.

Figure 1:
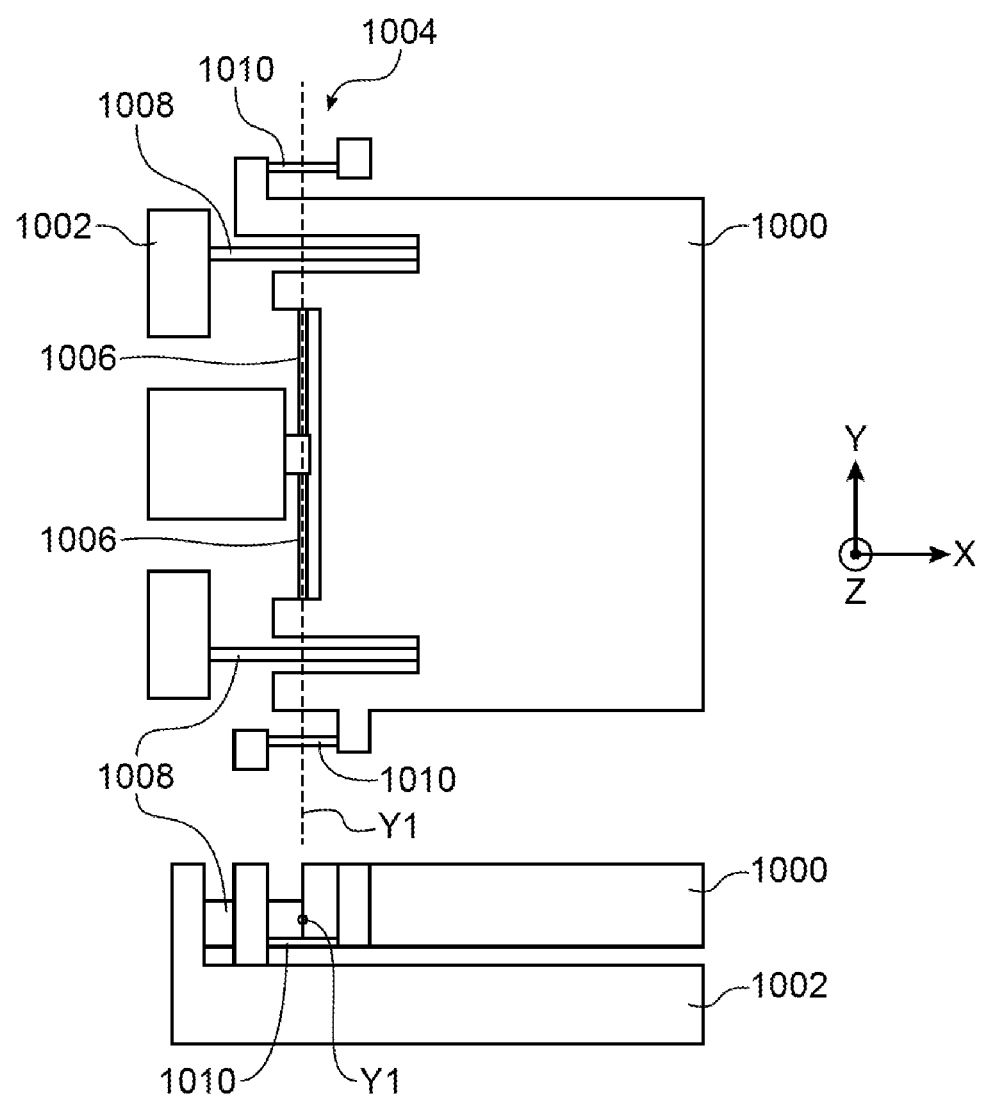
FIG. 1 is a top view of a structure of the prior art.

When a force in the plane is applied to the movable part, in the absence of the beam 28, the movable part of the structure S3 is more likely to be displaced in the plane than a movable part of a structure with bending beams that are wider than that of FIG. 1.

Indeed a slight misalignment of the two bending beams of an assembly E3 authorises a deformation mode of the two beams in bending along the direction Y which generates a slight resulting deformation in the direction X. For this, the free end of the bending beams in the plane and is displaced in Y.

The beam 28 links the two ends of the two assemblies E3, which would tend to be displaced in incompatible movements. The deformation mode in the plane is then prohibited. The structure thus has a rigidity in translation in the direction X, equivalent to that of the structure of the prior art of FIG. 1.

Figure 5A:
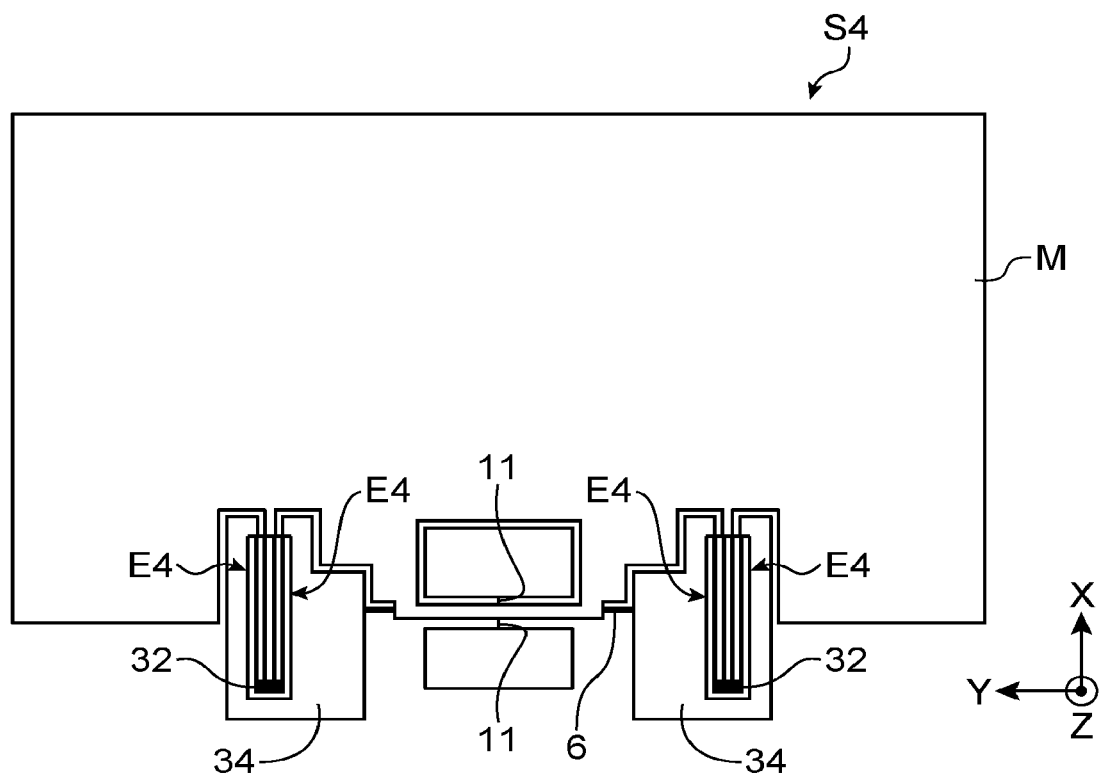
FIG. 5A is a top view of a structure according to another embodiment that implements connecting elements between the bending elements.
Figure 5B:
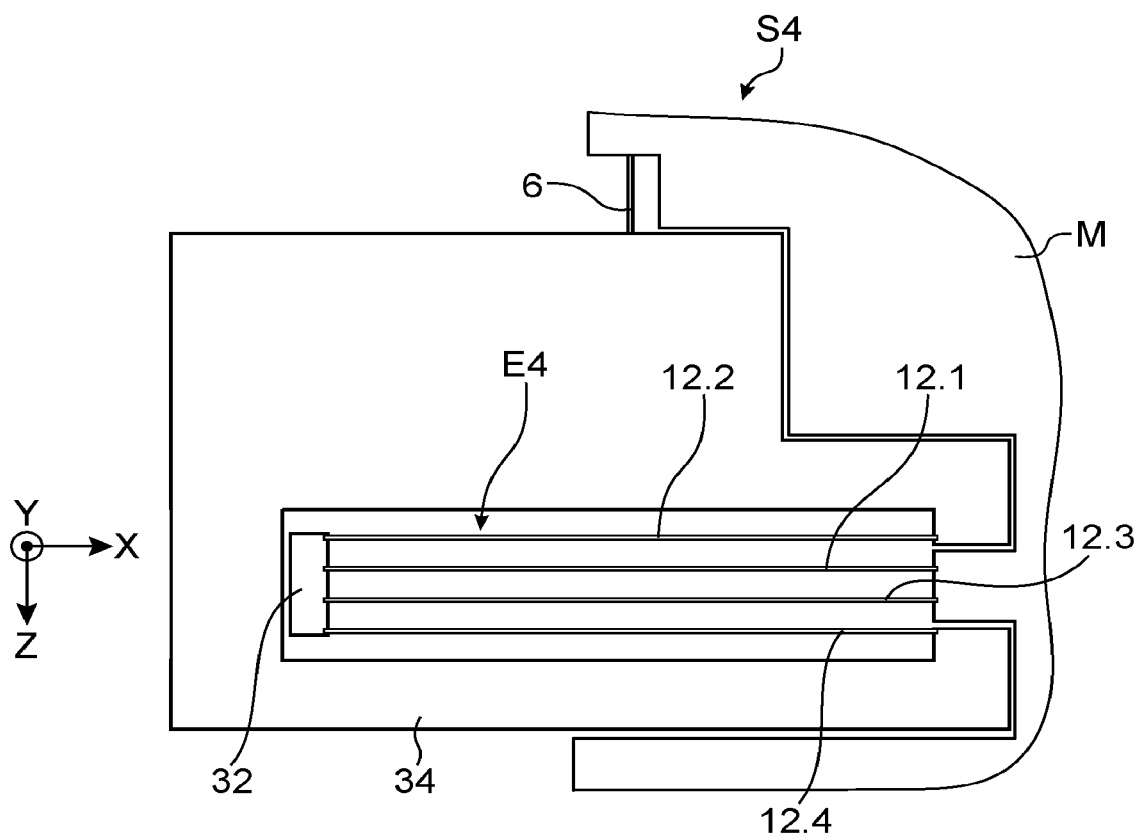
FIG. 5B is a detailed view of FIG. 5A.

FIGS. 5A and 5B show another example of a structure S4 implementing connecting means between the bending elements.

In this example, the structure S4 comprises four bending elements E4 i.e. four pairs of bending beams.

The bending elements E4 are distributed two by two, symmetrically with respect to an axis X1.

The two bending elements E4 of a pair comprise four bending beams 12.1, 12.2, 12.3, 12.4 connected together at the free end thereof by a rigid connecting means 30. In this example it is a rigid beam 32.

In this example, two beams 12.1 and 12.3 are connected by a longitudinal end to the movable part M, the two beams 12.2, 12.4 are connected by a longitudinal end to an anchoring stud 34. In this example, the anchoring stud 34 is common to the two bending beams 12.2, 12.4 and to a torsion beam 6.

The rigid beam 32 mechanically connects the free ends of the four beams 12.1, 12.2, 12.3, 12.4.

The structure of the other pair of elements E4 is similar to that described hereinabove.

The rigid beams 32 have the same function as the beam 28 of the structure S3. They limit the displacement in the plane of the movable part. The explanations on the action of the beam 28 apply to the beams 32.

The gauges 11 are advantageously aligned.

The structure S4 offers as advantage a relatively compact structure in relation to the structure S3.

Implementing a rigid link between the bending elements, as is the case in the structures of FIGS. 4, 5A and 5B, has the advantage of reducing the sensitivity along the direction X, but also of increasing the sensitivity in the direction Z of displacement. Indeed, the rigid connecting element between the bending elements prohibits the deformation modes in the direction X other than compression which is applied to the stress gauges.

Figure 6:
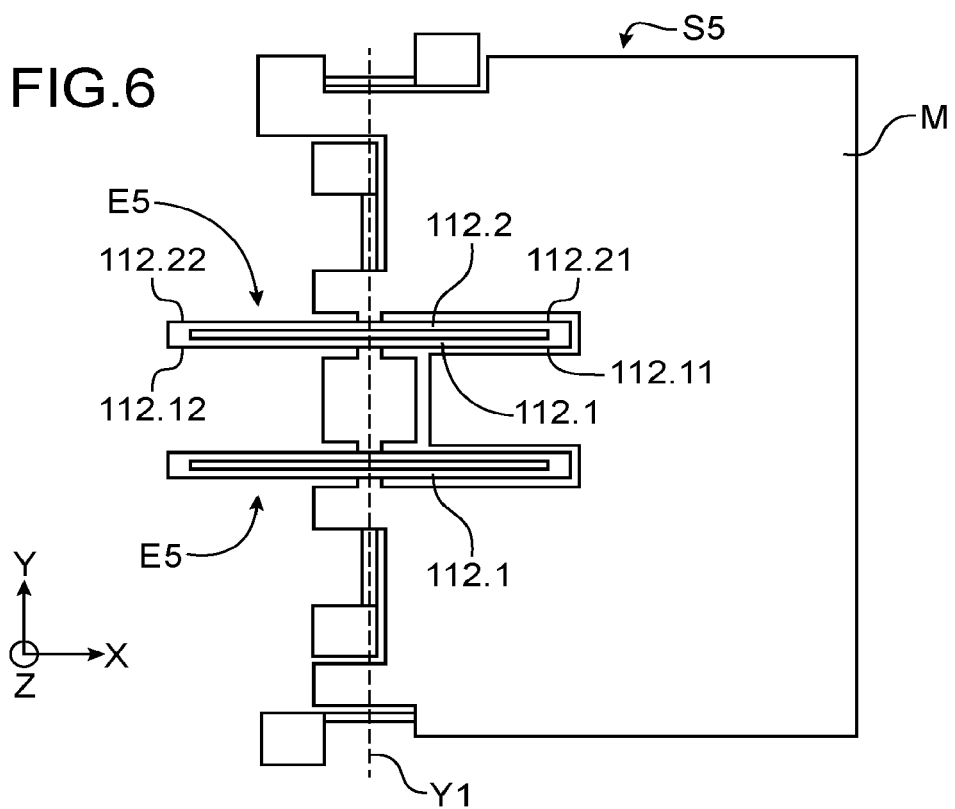
FIG. 6 is a top view of a structure according to another embodiment.

In FIG. 6, another embodiment of a structure S5 is shown. The bending elements E5 each comprise a pair of bending beams 112.1, 112.2 connected together mechanically by the free ends thereof. The longitudinal end 112.11 of the beam 112.1 is directly connected to the longitudinal end 112.21 of the beam 112.2 and the longitudinal end 112.12 of the beam 112.1 is directly connected to the longitudinal end 112.22 of the beam 112.2. The bending element E5 then substantially has the shape of a rectangle.

Furthermore, the bending beam 112.2 is mechanically connected directly to the movable part M at the middle thereof, and the beam 112.1 is mechanically connected to the support at the middle thereof.

In the example shown the two assemblies E5 are connected to the same anchoring stud, but this is not limiting.

In this example, the stresses internal to the bending beams can be released at the two longitudinal ends of each bending beam, without applying between the support and the movable part and causing the deformation thereof.

The axis of rotation Y1 passes through the zones of the bending beams anchored to the support and to the movable part. This structure has an angular stiffness that is substantially higher than that of the structure S1, about 4 times higher.

This structure has the advantage of making it possible to align the anchoring studs, the connection of the mass and the axis of rotation. This aligned arrangement makes it possible to reduce the sensitivity of the structure to a deformation of the substrate, that would for example be due to different expansions between the substrate and a housing of the device comprising the structure.

Figure 8:
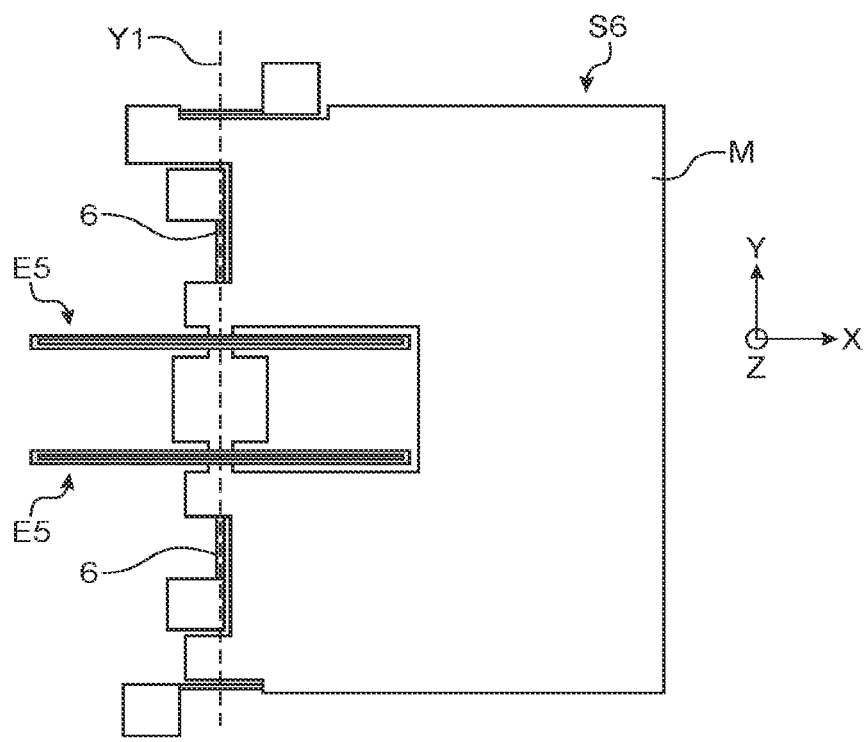
FIG. 8 is a top view of a structure according to another embodiment.

In this example, the movable mass is structured in such a way as to arrange a housing to receive a portion of each bending element. Alternatively, the structure S6 comprises a single housing receiving the two bending elements such as is shown in FIG. 8.

Figure 7:
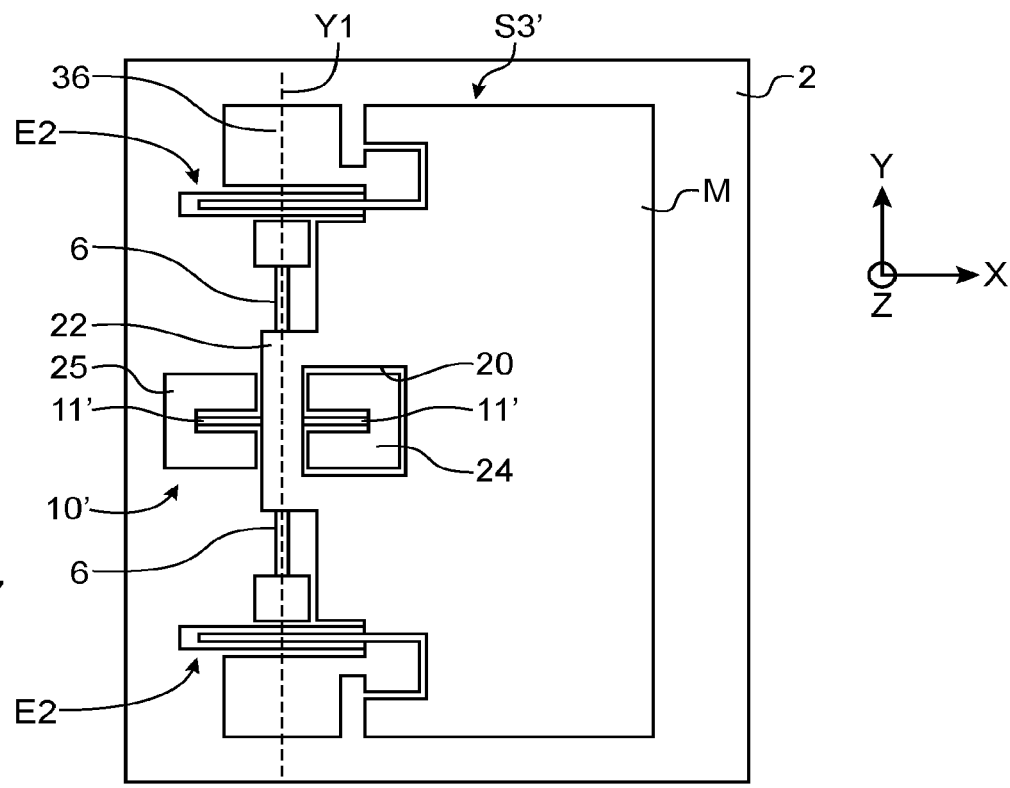
FIG. 7 is a top view of an advantageous alternative S3' of the structure S3 of FIG. 4.

FIG. 7 shows an example of a very advantageous structure S3' that takes the structure S3 wherein the anchoring studs 36 of the bending elements E3' are disposed on the axis Y1. This structure has a low angular stiffness, a reduced sensitivity to the forces in the plane and a reduced sensitivity to the deformation of the substrate.

Figure 9:
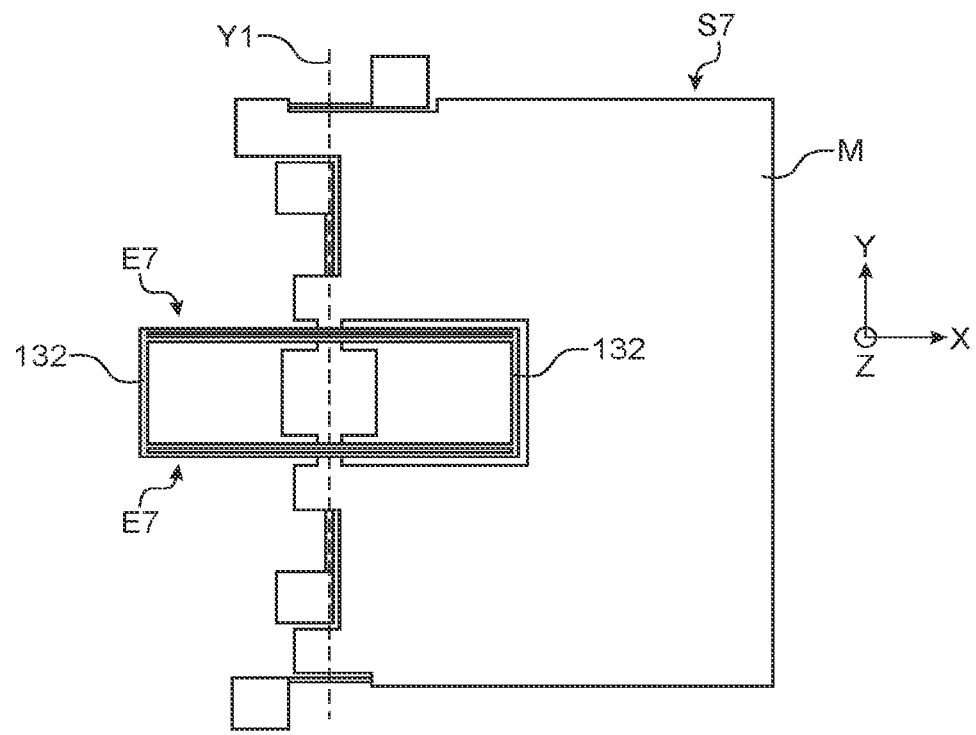
FIG. 9 is a top view of a structure close to that of FIG. 8 and implementing a connecting element between the bending elements.

FIG. 9 shows a structure S7 close to the structure S6 comprising connecting means between the bending elements E7 and which makes it possible to increase the holding in the direction X. In the example shown, a rigid beam 132 connects two free ends of the assemblies E7 and a rigid beam 132 connects the two other free ends of the assemblies E7.

Alternatively, a single rigid beam 132 is provided between two free ends of two elements. This alternative has a reduced resistance in the direction X with respect to the structure S7.

Figure 10:
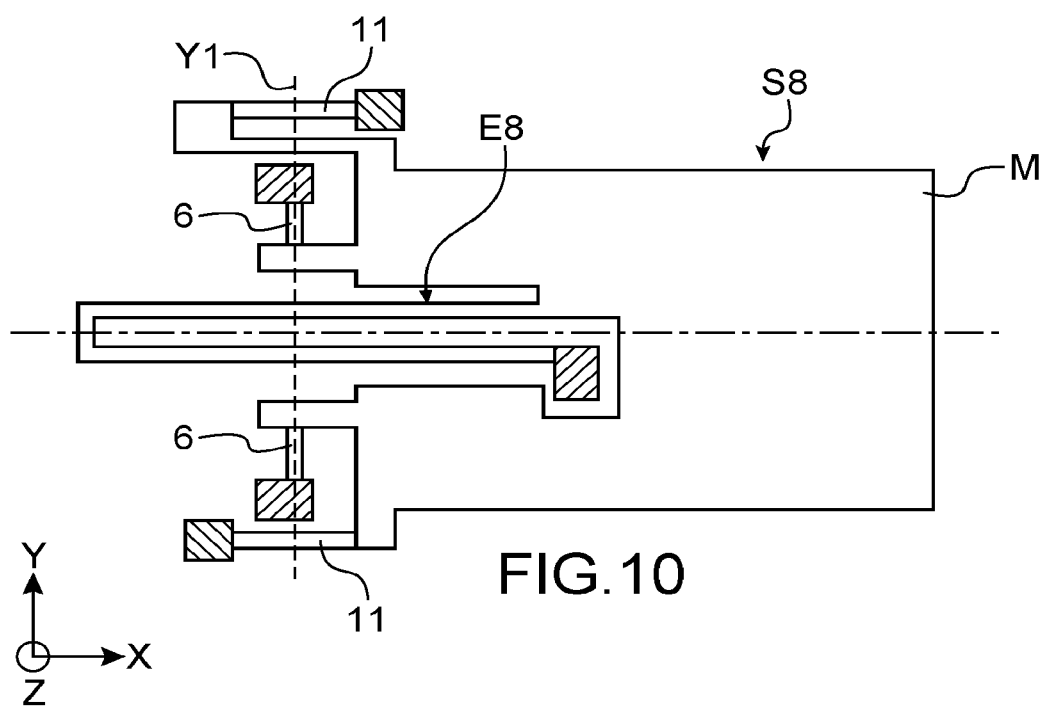
FIG. 10 is a top view of a structure according to another embodiment implementing a single bending element.

FIG. 10 shows another example of a structure S8 comprising a single bending element E8. Advantageously, the latter is aligned with an axis of symmetry that provides a balancing of the structure. However a structure comprising a single bending element that would not be aligned with an axis of symmetry of the structure belongs to the scope of the present invention.

The structure also comprises two torsion beams 6 disposed on either side of the bending element E8 and means of detection comprising two stress gauges 11 symmetrically disposed on either side of the bending element E8. The bending element E8 is similar to the one of FIG. 2. Alternatively the bending element is similar to the bending element E5 of the structure S5.

A structure comprising a single bending element and a single torsion beam belongs to the scope of the present invention.

In the examples described, the means of detection comprise piezoresistive gauges. Alternatively, the means of detection comprise piezoelectric gauges. Again alternatively, the means of detection comprise one or more resonating beams. For this, an electrode is disposed in such a way as to create an electrostatic force on the gauge so as to put it into resonance. The variation in the resonance frequency of the gauge due to the stress is measured by means of a specific circuit that can be a phase-locked loop.

It will be understood that the arrangements of the bending elements in relation to the bending beams and/or in relation to the means of detection can vary.

In the examples described and advantageously, the axis of rotation Y1 passes through the middle of the bending beams. However a structure wherein the axis of rotation Y1 would not pass through the middle of the bending beams belongs to the scope of the present invention, the hinge would then have a greater angular stiffness.

Figure 11:
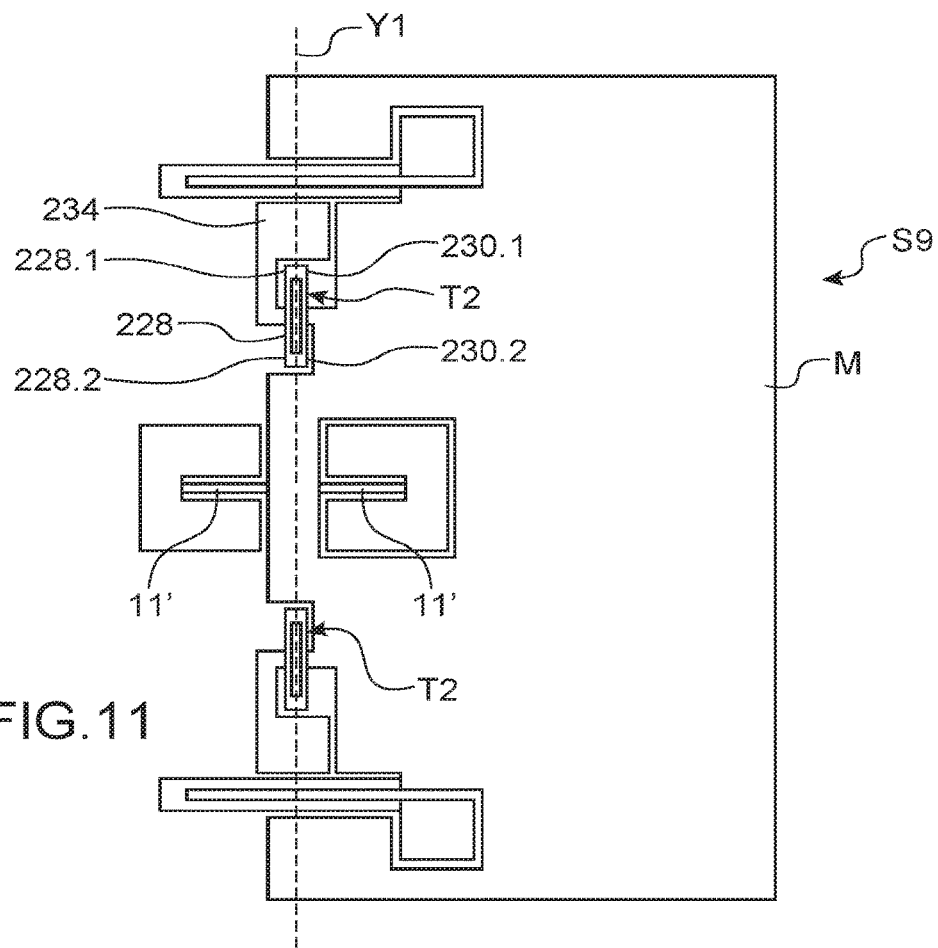
FIG. 11 is a top view of a variant of the structure of FIG. 3.

FIG. 11 shows a structure S9 comprising torsion elements according to a variant embodiment.

In this alternative, the torsion elements T2 comprise at least one pair of torsion beams mechanically connected together in series.

The two torsion elements have similar structures, only one of the torsion elements T2 will be described in detail.

The torsion element T2 comprises a pair of torsion beams 228, 230 disposed parallel with each other and disposed symmetrically in relation to the axis of rotation Y1 in such a way that their combined actions effectively define the axis of rotation Y1.

The two torsion beams are directly connected to each other by the longitudinal ends thereof 228.1, 230.1 and 228.2, 230.2 respectively in such a way as to form a rectangle. The connection between the longitudinal ends 228.1, 330.1 and the connection between the longitudinal ends 228.2, 230.2 are rigid with respect to the beams 228, 230. Moreover the bending beam 228 is directly connected to the support via an anchoring stud 234, for example at the middle thereof, and the bending beam 230 is directly connected to the movable part, for example at the middle thereof.

The ends 228.1, 230.1 and the ends 228.2, 330.2 of the beams 228, 230 are free to be displaced, allowing the stresses internal to the torsion beams 228, 230 to be released. As the stresses of beams 228 and 230 are very close, the ends thereof 228.1, 230.1 and 228.2, 230.2 will be displaced substantially identically and the rigid connection between them does not hinder the releasing of the stresses.

Preferably, the beams of each pair of beams of a bending element have the same dimensions.

The various bending elements can have different dimensions from one another.

Alternatively, the torsion beams 228 and 230 are connected only by one of the ends thereof for example by the ends 228.2 and 230.2, and the ends 228.1 and 230.1 correspond to the fastening to the anchoring stud 234 and to the movable part respectively.

The structures S1 to S11 described hereinabove comprise advantageously at least one lower abutment and/or at least one upper abutment in order to limit the amplitude of out-of-plane displacement of the movable part and to prevent damage to the structure, for example when an external impact is applied to the structure. The abutments are of the type well known to those skilled in the art and will not be described any further.

Abutments to limit the movements in the plane can also be considered.

In the case where the structure is used to produce an actuator, means for displacing in the out-of-plane direction the movable part are provided, for example this is electrostatic means.

Furthermore the integration of the bending elements, of the torsion beams or torsion elements in the movable part can be more or less substantial according to the space available and/or the mass required for the movable part, which makes it possible to offer a large number of structure configurations that can be adapted to many applications.

Thanks to the invention the position of the movable part in relation to the substrate is known and is not modified during the release of the movable part.

The structure can be produced by conventional techniques of microelectronics, without adding any complex step, for example the embodiment described in document EP2211185 can be implemented.

An example embodiment shall be described hereinbelow.

Figure 12A:
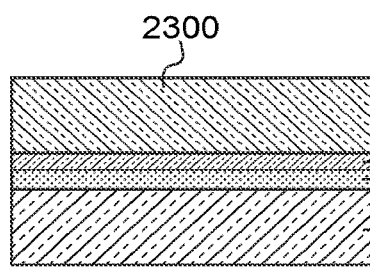
FIGS. 12A, 12B and 12C diagrammatically show a part of the steps of an example of a method for producing a structure according to the invention.

For example, from a Silicon On Insulator (SOI) substrate, comprising a layer 2000 of silicon, a layer 2100 of silicon oxide and a layer 2200 of monocrystalline silicon, the method comprises:

A step of forming a layer of monocrystalline silicon 2300 for example by epitaxial deposition of silicon on the layer 2200 (FIG. 12A).

Figure 12B:
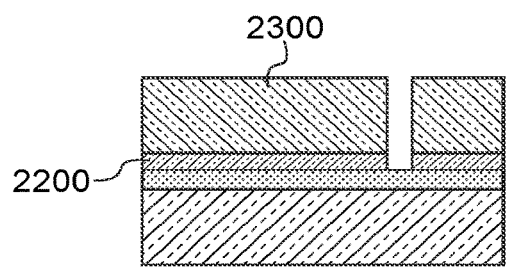

A step of structuring layers 2200 and 2300 by photolithography and etching in order to delimit the movable part, the gauge or gauges, and the hinge comprising the torsion beam or beams and the bending element or elements (FIG. 12B). For example the gauges are produced solely in the layer 2200. In this case, prior to the formation of the layer 2300, the structuring of the layer 2200 in order to form the gauge or gauges is carried out, for example by etching, and the protection of the gauge or gauges for example by the forming and structuring of an oxide layer. The bending elements are produced in the layer 2200 and a portion of the layer 2300 and the torsion beams are produced in the layer 2200 and in the entire thickness of the layer 2300.

Figure 12C:
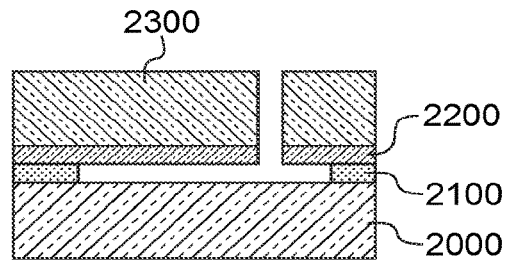

A step of releasing the movable part and the hinge by etching of the layer 2100 for example by means of hydrofluoric acid (FIG. 12C).

During the deposition of the layer 2300, stresses in compression can be generated in the latter, in particular in case of doping. The implantation of dopant in the layer 2200 can also generate stresses in this lower layer.

Thanks to the invention, during the release of the movable part the effect of the releasing of the stresses internal to the layer 2300 in the direction X has a reduced effect on the configuration of the structure.

The hinges according to the invention are particularly adapted to the production of structures for M&NEMS systems used for producing sensors or actuators.

The invention claimed is:

1. A hinge for a micromechanical and/or nanomechanical structure comprising:
    a support,
    a movable part in an out-of-plane direction with respect to the support, said hinge configured to suspend the movable part from the support allowing for an out-of-plane displacement of the movable part,
    a torsion element comprising a beam aligned with or parallel to the axis of rotation of the hinge and configured to be deformed in torsion, and
    a bending element configured to be deformed in bending, said bending element mechanically connecting the movable part and the support and comprising a pair of a first beam and a second beam parallel with each other and extending in a plane perpendicular to the axis of rotation of the hinge, the first beam being directly connected to the support and not being directly connected to the movable part and the second beam being directly connected to the movable part and not being directly connected to the support, the first and second beams being connected to one another by a first connecting element at first longitudinal ends thereof, the first connecting element being different from the support and from the movable part, the first and second beams extending in the same direction from the first connecting element, the first longitudinal end of the first beam being on a first side of the axis of rotation, a second longitudinal end of the first beam being on a second side of the axis of rotation, the first longitudinal end of the second beam being on the first side of the axis of rotation and a second longitudinal end of the second beam being on the second side of the axis of rotation.

2. The hinge according to claim 1, wherein the first and second beams are connected to one another at the first and second longitudinal ends thereof, and wherein the first beam is connected directly to the support at an intermediate zone between the first and second longitudinal ends thereof and the second beam is directly connected to the movable part at an intermediate zone between the first and second longitudinal ends thereof.

3. The hinge according to claim 2, wherein the intermediate zones are middles of the first and second beams.

4. The hinge according to claim 1, wherein the first beam is connected by the second longitudinal end thereof to the support and by the first longitudinal end thereof to the first longitudinal end of the second beam, and the second beam is connected by the second longitudinal ends thereof to the movable part.

5. The hinge according to claim 1, comprising at least two bending elements.

6. The hinge according to claim 5, further comprising a rigid connecting element between the at least two bending elements extending along a direction parallel to the axis of rotation.

7. The hinge according to claim 6, wherein the bending elements are disposed on either side of the at least one torsion beam.

8. The hinge according to claim 5, wherein the at least two bending elements are disposed on either side of the torsion beam.

9. The hinge according to claim 1, comprising two torsion elements each comprising a torsion beam aligned with the axis of rotation.

10. The hinge according to claim 1, wherein the torsion element comprises a first torsion beam and a second torsion beam, and said torsion beam forms the first torsion beam, the first and second torsion beams being parallel to one another, and connected together by at least one of the longitudinal ends thereof, one of the torsion beams being mechanically connected directly to the movable part and the other torsion beam being mechanically connected directed to the support.

11. The hinge according to claim 10, comprising two pairs of torsion beams aligned relative to each other along the axis of rotation.

12. The hinge according to claim 1, comprising a stack of layers partly etched, wherein at least the first and second beams of the bending element are made in the same layer.

13. A micromechanical and/or nanomechanical structure comprising:
a support,
a movable part in the out-of-plane direction, and
a hinge according to claim 1 connecting the movable part to the support.

14. The structure according to claim 13, further comprising an out-of-plane abutment for the mass moving away from and/or moving towards the support.

15. A microelectromechanical system comprising at least one structure according to claim 13.

16. The microelectromechanical system according to claim 15, comprising a sensor for measuring the displacement of the movable part in the out-of-plane direction, comprising at least one stress gauge.

* * * * *